(12) United States Patent
Winings

(10) Patent No.: US 6,511,344 B2
(45) Date of Patent: Jan. 28, 2003

(54) DOUBLE-DECK ELECTRICAL CONNECTOR WITH CROSS-TALK COMPENSATION

(75) Inventor: Clifford L. Winings, Etters, PA (US)

(73) Assignee: FCI Americas Technology, Inc., Reno, NV (US)

(*) Notice: Subject to any disclaimer, the term of this patent is extended or adjusted under 35 U.S.C. 154(b) by 0 days.

(21) Appl. No.: 09/897,166

(22) Filed: Jul. 2, 2001

(65) Prior Publication Data

US 2003/0003799 A1 Jan. 2, 2003

(51) Int. Cl.[7] .............................................. H01R 13/60
(52) U.S. Cl. ................... 439/541.5; 439/676; 439/941; 174/250
(58) Field of Search ............................. 439/676, 541.5, 439/941; 174/250

(56) References Cited

U.S. PATENT DOCUMENTS

| | | | |
|---|---|---|---|
| 5,287,066 A | 2/1994 | Liron et al. | 328/163 |
| 5,299,956 A | 4/1994 | Brownell et al. | 439/638 |
| 5,310,363 A | 5/1994 | Brownell et al. | 439/676 |
| 5,454,738 A | 10/1995 | Lim et al. | 439/676 |
| 5,562,479 A | 10/1996 | Pallas et al. | 439/404 |
| 5,618,185 A | 4/1997 | Aekins | 439/76.1 |
| 5,628,647 A | 5/1997 | Rohrbaugh et al. | 439/404 |
| 5,679,027 A | 10/1997 | Smith | 439/676 |
| 5,700,167 A | 12/1997 | Pharney et al. | 439/676 |
| 5,716,237 A | 2/1998 | Conorich et al. | 439/607 |
| 5,797,764 A | 8/1998 | Coulombe et al. | 439/55 |
| 5,841,620 A | 11/1998 | Masghati | 361/119 |
| 5,844,783 A | 12/1998 | Kojima | 361/777 |
| 5,961,349 A | 10/1999 | Paagman | 439/607 |
| 6,107,578 A | 8/2000 | Hashim | 174/250 |
| 6,139,371 A * | 10/2000 | Troutman et al. | 439/676 |
| 6,155,881 A * | 12/2000 | Arnett et al. | 439/676 |
| 6,165,018 A * | 12/2000 | Arnett et al. | 439/941 |
| 6,193,560 B1 * | 2/2001 | Morana et al. | 439/541.5 |
| 6,206,725 B1 * | 3/2001 | Wu | 439/541.5 |
| 6,250,957 B1 * | 6/2001 | Chang | 439/541.5 |
| 6,250,968 B1 * | 6/2001 | Winings | 439/676 |
| 6,296,518 B1 * | 10/2001 | Avery et al. | 439/541.5 |
| 6,409,547 B1 * | 6/2002 | Reede | 439/676 |

FOREIGN PATENT DOCUMENTS

| | | |
|---|---|---|
| EP | 0 854 664 A1 | 7/1998 |
| EP | 0 856 853 A1 | 8/1998 |
| EP | 0 880 202 A2 | 11/1998 |
| EP | 0 901 201 A1 | 3/1999 |
| GB | 2 314 466 A | 12/1997 |
| GB | 2 331 873 A | 6/1999 |
| WO | WO 94/05092 | 3/1994 |

OTHER PUBLICATIONS

Walker, C.S. "Capacitance, Inductance, and crosstalk Analysis", Artech House, 1990, pp 66–71.

U.S. patent application Ser. No. 09/353,184, Winings, filed Jul. 14, 1999.

* cited by examiner

Primary Examiner—P. Austin Bradley
Assistant Examiner—Briggitte R. Hammond
(74) Attorney, Agent, or Firm—Woodcock Washburn LLP

(57) ABSTRACT

An electrical-connector system includes an electrical connector having a plurality of upper signal contacts arranged in at least two rows of vertically-aligned pairs. A plurality of tails electrically couple the upper signal contacts to a circuit substrate. The upper tails have a predetermined length and are spaced apart by one or more predetermined distances so that the upper tails produce a compensating cross-talk. The compensating cross-talk offsets a cross-talk produced by the upper signal contacts. The electrical-connector system also includes a plurality of lower signal contacts electrically coupled to the substrate. The lower signal contacts are substantially located between the upper signal contacts and the circuit substrate.

30 Claims, 12 Drawing Sheets

DOUBLE-DECK ELECTRICAL CONNECTOR WITH CROSS-TALK COMPENSATION

FIELD OF THE INVENTION

The present invention relates to electrical-connector systems. More specifically, the invention is directed to electrical-connector systems that minimize cross-talk.

BACKGROUND OF THE INVENTION

Cross-talk occurs when electrical signals are transmitted through an electrical connector. More particularly, the transmission of electrical signals through a conductor of an electrical connector induces a voltage across other conductors within the same connector. This induced voltage is commonly referred to as cross-talk.

Cross-talk within contemporary electrical connectors must be controlled to be within increasingly stringent standards. Factors such as the ongoing miniaturization of electrical connectors and increases in the operating speeds of electronic systems necessitate greater control of cross-talk. For example, ANSI/EIA/TIA/568A Category-5 requirements limit pair-to-pair near (next)-end cross-talk to –40 dB at 100 Mhz.

Various methods and devices have been developed to reduce cross-talk in electrical connectors. For example, U.S. Pat. No. 5,562,479 describes an electrical connector in which conductors within the connector are disposed in side-by-side alignment over a predetermined distance. This arrangement causes cross-talk from one conductor to be offset by cross-talk produced in a mating portion of the connector.

Another cross-talk reduction technique is described in co-pending U.S. patent application Ser. No. 09/353,184, filed Jul. 14, 1999 and titled "Electrical Connector System with Cross-Talk Compensation," which is incorporated herein by reference in its entirety. This application discloses a technique by which cross-talk is produced through a particular pattern of conductor traces formed in a circuit substrate. The cross-talk produced in the substrate offsets cross-talk that is produced within an electrical connector mounted on the substrate.

The above-noted techniques have proven effective at reducing cross-talk in electrical-connector systems. The need to accommodate cross-talk compensation circuitry within the connector or the connector substrate, however, limits the extent to which connector systems that utilize these techniques can be miniaturized. Hence, a need currently exists for an electrical-connector system that produces suitable levels of cross-talk while occupying a minimal amount of area on a circuit substrate.

SUMMARY OF THE INVENTION

A presently-preferred embodiment of an electrical-connector system comprises an electrical connector. The electrical connector comprises a plurality of upper signal contacts arranged in at least two rows of vertically-aligned pairs. The electrical connector also comprises a plurality of upper tails. Each of the upper tails has a first end electrically coupled to a respective upper signal contact. Each of the upper tails also has a second end electrically coupled to a circuit substrate. The upper tails each have a predetermined length and are spaced apart by one or more predetermined distances so that the upper tails produce a first compensating cross-talk. The first compensating cross-talk offsets an unwanted cross-talk produced by the upper signal contacts.

The electrical connector also comprises a plurality of lower signal contacts electrically coupled to the substrate. The lower signal contacts are aligned with the upper signal contacts so that the lower signal contacts are substantially located between the upper signal contacts and the circuit substrate.

One particular embodiment of the electrical-connector system further comprises the circuit substrate. The circuit substrate has a plurality of layers. At least a first, a second, and a third trace are formed on the substrate. Each of the first, second, and third traces are electrically coupled to a respective lower signal contact. In addition, the first trace includes a first portion on at least one of the plurality of layers and adjacent a portion of the second trace to produce a second compensating cross-talk. The first trace also includes a second portion on at least one of the plurality of layers and adjacent a portion of the third trace to produce a third compensating cross-talk. The second and the third compensating cross-talks offset an unwanted cross-talk between the lower signal contacts.

Further in accordance with the above-noted object, a presently-preferred embodiment of an electrical connector adapted to engage a circuit substrate comprises an upper connector portion. The upper connector portion comprises a plurality of upper signal contacts arranged in at least two rows of vertically-aligned pairs. The upper connector portion also comprises a plurality of tails each having a pre-determined length. Each of the vertically-aligned pairs of upper signal contacts is electrically coupled to a respective first and second tail. The first and the second tails are positioned substantially side-by-side. The plurality of tails are substantially co-planar and are spaced apart by one or more pre-determined distances so that the tails produce a compensating cross-talk that offsets an unwanted cross-talk produced by the upper signal contacts.

The electrical connector also comprises a lower connector portion that is substantially aligned with the upper connector portion so that the lower connector portion is substantially located between the upper connector portion and the circuit substrate.

A further object of the present invention is to provide method of reducing cross-talk in an electrical-connector system mounted to a circuit substrate. In accordance with this object, a presently-preferred method of reducing cross-talk in an electrical-connector system mounted to a circuit substrate comprises the step of providing an electrical-connector system having a lower electrical connector and a stacked, upper electrical connector, each electrical connector including contacts with tails and producing an unwanted cross-talk. The method also comprises the steps of providing a circuit substrate to receive the tails, and producing a compensating cross-talk in the tails of the contacts of the upper connector to reduce the unwanted cross-talk of the upper connector. The method further comprises the step of producing a compensating cross-talk in the circuit substrate to reduce the unwanted cross-talk of the lower connector.

BRIEF DESCRIPTION OF THE DRAWINGS

The foregoing summary, as well as the following detailed description of the preferred embodiment, is better understood when read in conjunction with the appended drawings. For the purpose of illustrating the invention, the drawings show an embodiment that is presently preferred. The invention is not limited, however, to the specific instrumentalities disclosed in the drawings. In the drawings.

DESCRIPTION OF PREFERRED EMBODIMENTS

A preferred embodiment of the invention is depicted in FIGS. 1 through 14. The figures are each referenced to a common coordinate system 10 depicted in each illustration. The invention provides an electrical connector system 12 that includes an electrical connector 14 and a circuit substrate 16.

Figure 1:
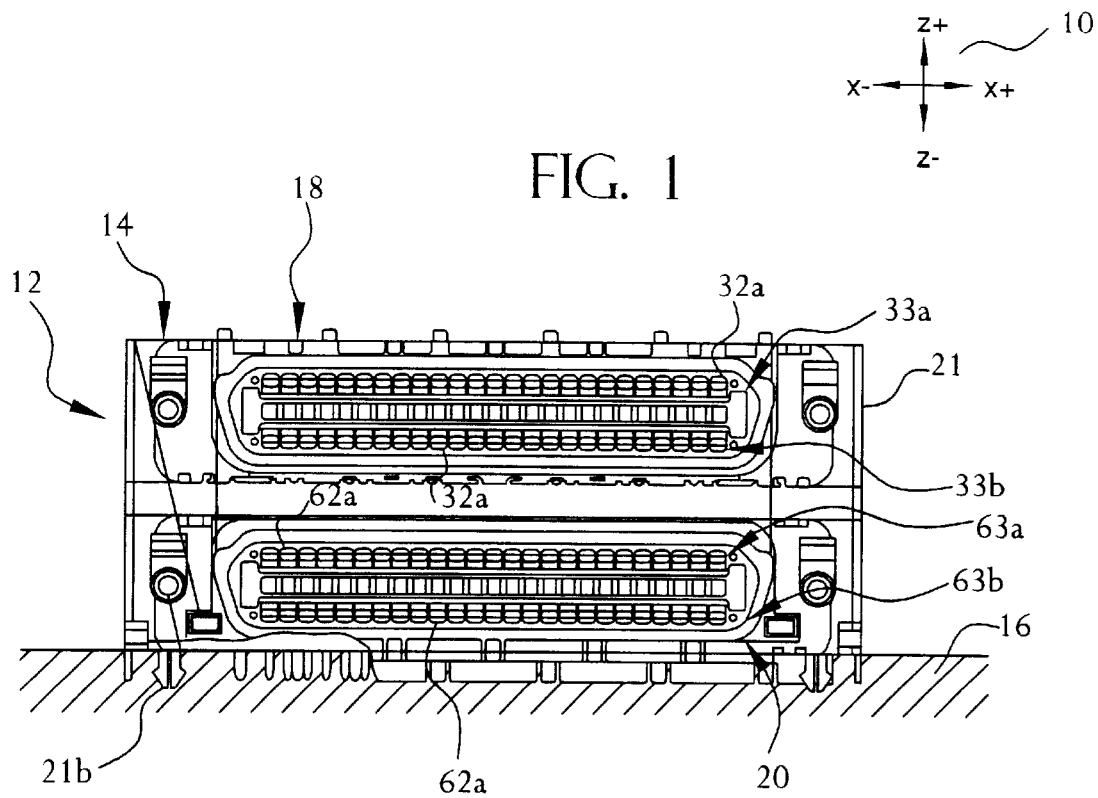
FIG. 1 is a front view of an electrical-connector system in accordance with the present invention.
Figure 2:
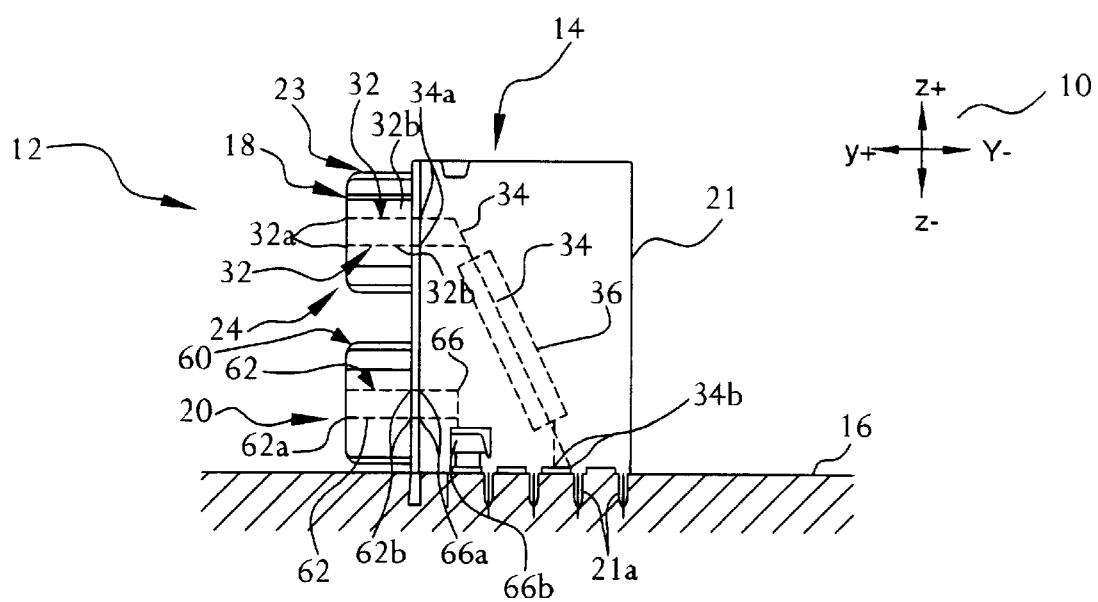
FIG. 2 is a side view of the electrical-connector system shown in FIG. 1.

The electrical connector 14 is a double-deck connector comprising an upper connector portion 18 and a lower connector portion 20 (see FIGS. 1 and 2). The upper connector portion 18 may comprise, for example, a Category Five, 25-pair PCB receptacle connector similar to part number 92509 available from Framatome Connectors International (FCI). The lower connector portion 20 may likewise comprise a receptacle connector similar to FCI part number 92509.

The upper and lower connector portions 18 and 20 are mounted in an outer shield 21. The outer shield 21 isolates the connector portions 18 and 20 from electromagnetic interference generated by electrical components located near the electrical connector 14. The outer shield 21 is preferably formed from a sheet of conductive metal such as phosphor-bronze with a tin-over-nickel-plated finish. The outer shield 21 includes one or more terminals 21a and the connector housing has one or more hold downs 21b secured thereto. The terminals 21a and the hold downs 21b engage the circuit substrate 16, as explained below.

Figure 3:
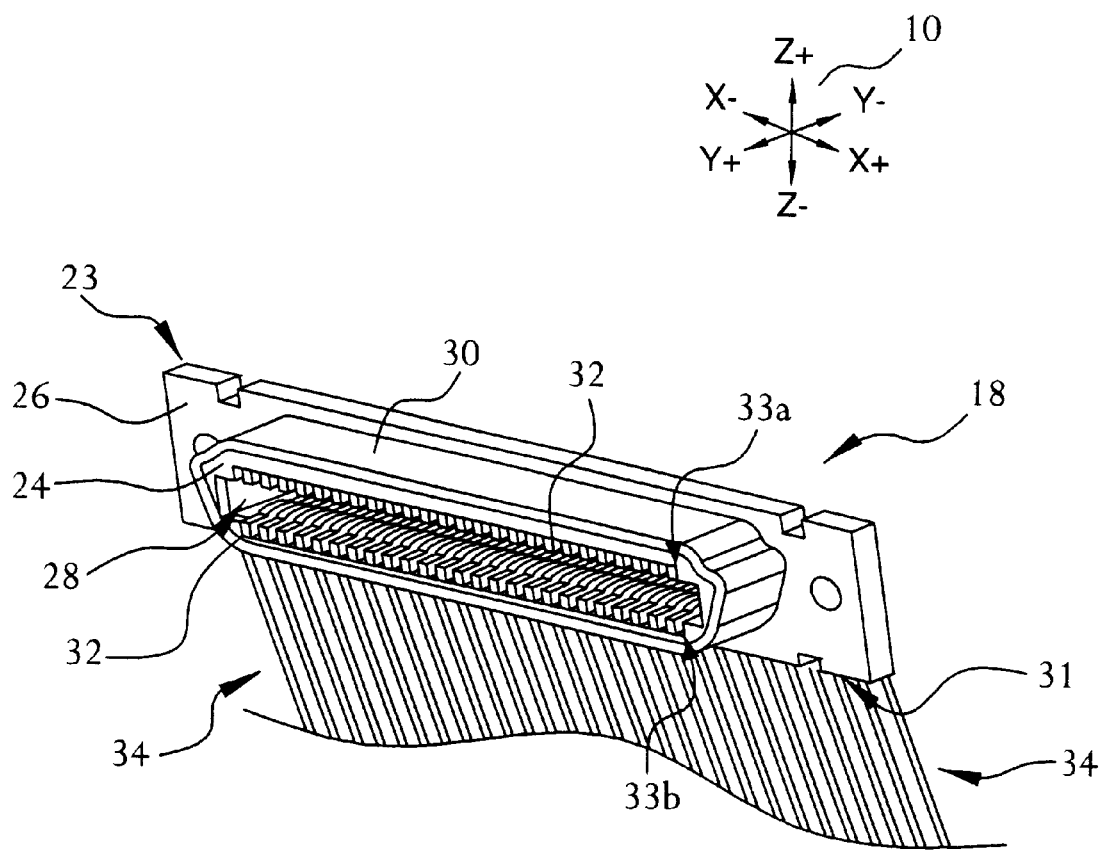
FIG. 3 is a perspective view of an upper connector portion of an electrical connector of the electrical-connector system shown in FIGS. 1 and 2.
Figure 4A:
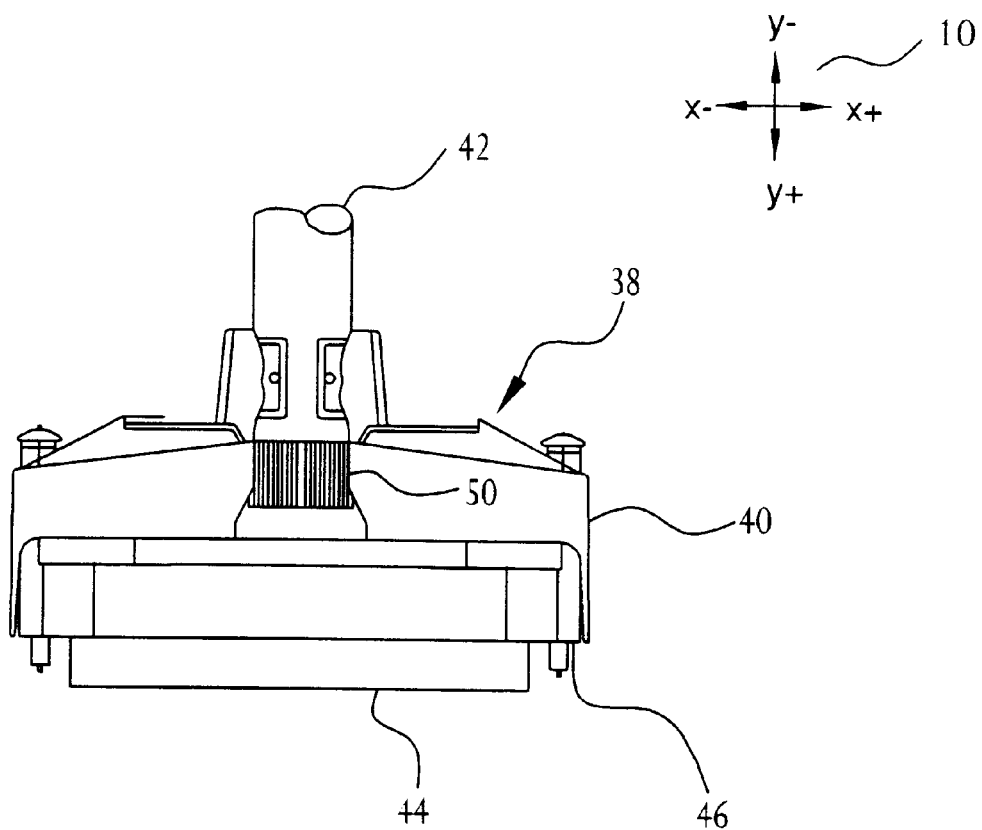
FIG. 4A is a top view of a cable plug that is adapted to mate with the electrical connector show in part in FIG. 3.
Figure 4B:
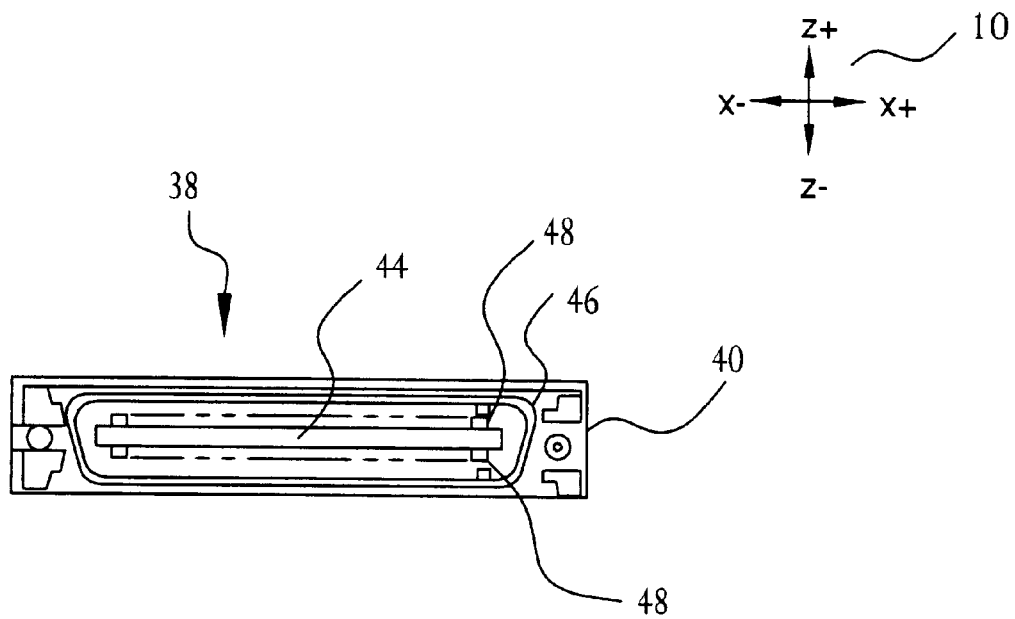
FIG. 4B is a front view of the cable plug shown in FIG. 4A.
Figure 5:
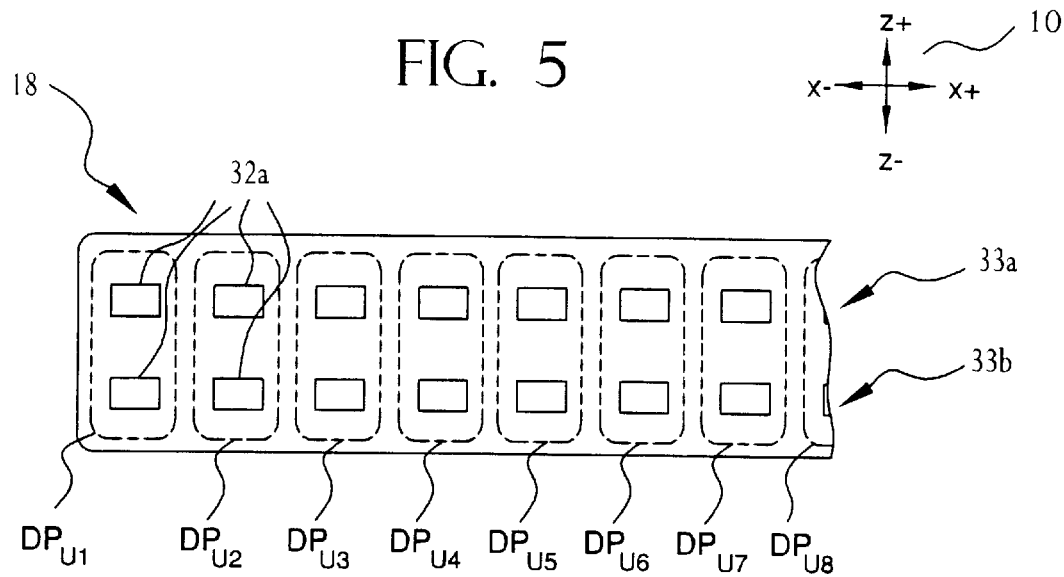
FIG. 5 is a diagrammatical front view of the upper connector portion shown in FIG. 3.

The upper connector portion 18 includes a housing 23 (see FIG. 3). The housing 23 may be formed a conventional insulative material such as glass-fiber-reinforced polyphenylene sulfide. The housing 23 comprises a mating portion 24. The mating portion 24 extends outwardly from a front face 26 of the housing 23. The mating portion 24 defines a central opening 28 that receives a mating connector (described below). A metal shell 30 covers the front face 26 and an outer perimeter of the mating portion 24. The housing 23 also includes a mounting portion 31. The upper connector portion 18 is mounted to the previously-described outer shield 21 via the mounting portion 31. The mounting portion 31 may be fixed to the outer shield 21 through conventional means such as by formed tabs on the shield 21.

The upper connector portion 18 further comprises a plurality of upper signal contacts 32 (see FIGS. 1–3). The upper signal contacts 32 may be formed from a conventional conductive material such as phosphor-bronze with a gold-over-nickel-plated finish. Each upper signal contact 32 includes a mating portion 32a and a terminal portion 32b (see FIG. 2). The mating portion 32a may comprise a simple cantilever beam, i.e., a propped cantilever beam, that is adapted to engage a respective plug-mounted contact when inserted into the mating or receptacle connector.

The upper signal contacts 32 are arranged in a first row 33a and an opposing second row 33b (see FIGS. 1–3). Each contact 32 in the first row 33a is vertically aligned with a respective contact 32 in the second row 33b. This arrangement forms a series of vertically-aligned differential contact pairs $DP_{Un}$, e.g., $DP_{U1}$, $DP_{U2}$, $DP_{U3}$, etc. (see FIG. 5). (The vertical direction corresponds to the z direction denoted on the coordinate system 10.)

The upper connector portion 18 further comprises a plurality of upper tails 34 (see FIGS. 2 and 3; all of the upper tails 34 are not depicted in FIG. 3, for clarity). A first end 34a of each upper tail 34 is electrically coupled to the terminal end 32b of a respective upper signal contact 32. A second end 34b of each upper tail 34 is electrically coupled to the circuit substrate 16. The upper tails 34 are preferably formed as part of an insert-molded lead frame 36, and are fixed to the terminal portions 32b by conventional means such as soldering. Alternatively, each upper tail 34 may be unitarily formed with a respective upper signal contact 32. Each upper tail 34 has a length of approximately 1.2 inches and a cross-section of approximately 0.008 by 0.050 inch.

Figure 6:
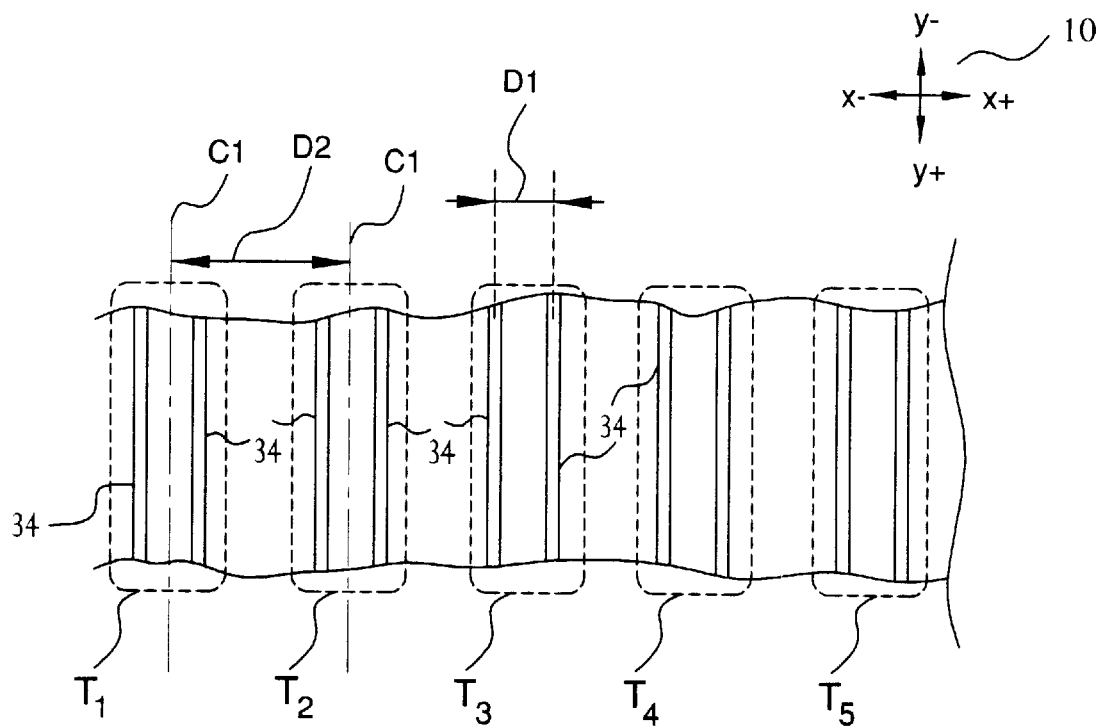
FIG. 6 is a diagrammatical top view of tails of the upper connector portion shown in FIGS. 3 and 5.

The upper tails 34 are grouped in pairs $T_n$ (see FIG. 6). Each tail pair $T_n$ is coupled to a corresponding differential pair $DP_{Un}$ of upper signal contacts 32. In other words, one of the tails 34 in each tail pair $T_n$ is coupled to one of the contacts 32 in a corresponding differential contact pair $DP_{Un}$, and the other of the tails 34 is coupled to the other contact 32 in the differential pair $DP_{Un}$. For example, the upper tails 34 of the tail pair $T_1$ are coupled to the contacts 32 of the differential contact pair $DP_{U1}$.

The tails 34 are substantially co-planar. More particularly, the tails 34 of each tail pair $T_n$ are positioned substantially side-by-side after the tails 34 have extended away from the respective contacts 32 by a predetermined distance (see FIGS. 2 and 6; the geometric features of the tails 34 that permit each tail pair $T_n$ to transition from a substantially vertical arrangement proximate the contacts 32 to a substantially side-by-side arrangement are not shown in the figures, for clarity). In addition, the tail pairs $T_n$ that correspond to adjacent differential contact pairs $DP_{Un}$ are positioned adjacent each other so that the tails 34 form a substantially planar array of tails 34. For example, the differential pairs $DP_{U1}$ and $DP_{U2}$ occupy adjacent positions in the upper connector portion 18 (see FIG. 5). The tails 34 of the first tail pair $T_1$ are coupled to the contacts 32 of the first differential contact pair $DP_{U1}$, as noted previously. The tails 34 of the second tail pair $T_2$ are coupled to the contacts 32 of the second differential contact pair $DP_{U2}$. The tails 34 within each tail pair $T_1$ and $T_2$ are positioned substantially side by side (see FIG. 6). In addition, the tail pairs $T_1$ and $T_2$ are positioned adjacent each other, thereby forming a substantially planar array of tails 34.

The tails 34 within each tail pair Tn are spaced apart by a predetermined distance D1 (see FIG. 6). In addition, the tails 34 within each tail pair Tn are disposed about a centerline C1 of that particular tail pair Tn. The centerlines C1 of adjacent tail pairs Tn are spaced apart by a predetermined distance D2. The distance D1 is preferably equal to at least one-half of the distance D2. (The spacing between the tails 34 is not drawn to scale in FIG. 6, for clarity.)

The tails 34 are preferably spaced apart with respect to a third direction by a distance no greater than one-half of the centerline-to-centerline distance D2. The third direction is normal to the plane in which the tails 34 are substantially located. In other words, the deviation of the tails 34 from absolute co-planarity is preferably no greater than one-half of the centerline-to-centerline distance D2. The significance of the noted arrangements of the upper signal contacts 32 and the tails 34 is discussed in detail below.

The upper connector portion 18 mates with, i.e., is adapted to receive, a suitable electrical connector. For example, the upper connector portion 18 can mate with a Category Five, 25-pair PCB cable plug 38 (see FIGS. 4A and 4B). This particular type of cable plug 38 may be obtained from FCI as part number 86005-003.

The cable plug 38 includes a housing 40. The housing 40 may be formed from a conventional insulative material such as thermoplastic. The cable plug 38 also comprises a cable 42 that terminates within the housing 40. The housing 40 includes a plate 44 that extends from a mating face 46 of the housing 40. The plate 44 enters the central opening 28 of the upper connector portion 18 when the cable plug 38 is mated to the upper connector portion 18.

The cable plug 38 further comprises a plurality of contacts 48 that extend through the housing 40. The contacts 48 of the exemplary cable plug 38 are insulation-displacement contacts. A terminal end of each contact 48 terminates to a respective wire 50 within the cable 48. A mating end of each contact 48 extends along the plate 44. The contacts 48 may be formed from a conventional conductive material such as phosphor-bronze. Each contact 48 preferably has a gold-over-nickel-finish on its mating end and a tin-lead-nickel finish on its terminal end.

The mating ends of the contacts 48 are arranged in two rows on opposing sides of the plate 44. In addition, each contact 48 in a first of the two rows is vertically aligned with a respective contact 48 in the other opposing row. The contacts 48 engage the upper signal contacts 32 when the upper connector portion 18 is joined to the cable plug 38.

The upper signal contacts 32 and the contacts 48 produce cross-talk when electrical signals are transmitted. More particularly, the transmission of electrical signals between the connector portion 18 and the cable plug 38 on any differential pair, e.g., $DP_{Un}$, induces a voltage on nearby differential pairs (particularly $Dp_{U(n-2)}$, $DP_{U(n-1)}$, $Dp_{U(n+1)}$, and $DP_{U(n+2)}$. This induced voltage is hereinafter referred to as "unwanted cross-talk."

Applicant has configured the upper tails 34 in a manner that causes the upper tails 34 to produce an induced voltage having a polarity that is opposite to the polarity of the unwanted cross-talk associated with the upper connector portion 18. This induced voltage is hereinafter referred to as "compensating cross-talk." The opposing polarities of the unwanted cross-talk and the compensating cross-talk cause the resultant cross-talk to be much lower in magnitude than the unwanted cross-talk. Hence, the present invention utilizes the upper tails 34 for cross-talk compensation as well as signal transmission. The substantial advantages associated with using the upper tails 34 for these two functions are discussed below. Technical details relating to the cross-talk reduction technique employed in the upper tails 34 are as follows.

The tails 34 produce a compensating cross-talk having a polarity that is opposite to the polarity of the unwanted cross-talk associated with the upper connector portion 18, as stated previously. This effect is achieved by orienting the upper tails 34 in the above-described manner. In particular, arranging the upper tails 34 in pairs $T_n$ that each correspond to a particular differential contact pair $DP_{Un}$, and placing the tail pairs $T_n$ in substantial side-by-side alignment over a predetermined distance causes the upper tails 34 to produce the compensating cross-talk. In addition, the spacing and the length of the tails 34 can be manipulated so that the magnitude of the compensating cross-talk is roughly equal to the magnitude of the unwanted cross-talk. Hence, the compensating cross-talk can be made to substantially offset the unwanted cross-talk. Theoretical details relating this cross-talk-reduction technique are as follows.

The inductive cross-talk, $X_1$ (in volts), between two pairs of conductors can be calculated according to the following expression:

$$X_1 = [(dI/dt)/2](M_{ac} - M_{ad} - M_{bd} - M_{bc})$$

where I represents a current applied to a first pair of conductors a and b (thereby inducing a voltage in a second idle pair of conductors c and d), and $M_{ac}$, $M_{ad}$, $M_{bd}$, and $M_{bc}$ are the mutual inductances between the various conductors.

The mutual inductance (in nH) between a pair of conductors x and y can be approximated using the following equation:

$$M_{xy} = 5L[ln[(r^{-1}) + (1+r^{-2})^{0.5} - (1+r^2)^{0.5} + r]]$$

where L is the conductor length (in inches) and r is the distance from conductor x to conductor y divided by the conductor length.

The capacitive cross-talk ($X_c$) between two pairs of conductors can be calculated according to the following expression:

$$X_c[(dV/dt)/2](Z)(C_m)$$

where V is the applied voltage across one pair of the conductors, $C_m$ is the mutual capacitance between the conductor pairs, and Z is the impedance between the near and far-ends of the idle pair of conductors.

The mutual capacitance ($C_m$) is a function of the shapes, spacing, and lengths of the conductor pairs. The mutual capacitance is also dependent upon the dielectric constants of the materials surrounding the conductors. Formulae are available to compute the mutual capacitance of relatively simple shapes (see, for example, *Capacitance, Inductance, and Cross-talk Analysis*, pp. 66–71, by Charles S. Walker, Artech House, 1990).

The cross-talk induced in an idle pair of conductors by another pair of conductors is a function of the inductive and capacitive cross-talks. The total cross-talk in a particular section of the idle conductor pair may be calculated using a standard power-sum method. Further details relating to this cross-talk-reduction technique are contained in U.S. Pat. No. 5,562,479, which is incorporated herein by reference in its entirety.

Hence, the magnitude of the compensating cross-talk produced by the upper tails 34 can be altered by manipulating the length of the tails 34, the spacing between the tails 34 within each tail pair $T_n$, and the spacing between adjacent tail pairs $T_n$. In particular, these various parameters can be manipulated so that the compensating cross-talk substantially equals the unwanted cross-talk, thereby reducing or canceling the unwanted cross-talk. The present invention thus facilitates the reduction or cancellation of the unwanted cross-talk associated with the upper connector portion 18 through the choice of appropriate design parameters for the tails 34. (Values for the length and spacing of the tails 34 were recited previously. These values are presented for exemplary purposes only. Optimal values for the noted parameters will vary for different connector configurations.)

Details relating to the lower connector portion 20 are as follows. The lower connector portion 20 is substantially similar to the upper connector portion 18. The lower connector portion 20 includes a housing 60 (see FIGS. 1 and 2). The housing 60 is substantially identical to the housing 23 of the upper connector portion 18 and, thus, the housing 60 will not be described in detail. The housing 60 is fixed to the outer shield 21 directly below the upper connector portion 18. The upper and lower connector portions 18 and 20 are thus disposed in a double-deck arrangement, with the lower connector portion 20 being substantially located between the upper connector portion 18 and the circuit substrate 16.

The lower connector portion 20 further comprises a plurality of lower signal contacts 62. The lower signal contacts 62 are substantially identical to the upper signal contacts 32. Each lower signal contact 62 includes a mating portion 62a and a terminal portion 62b (see FIG. 2). The lower signal contacts 62 are arranged in a first row 63a and an opposing second row 63b, in a manner substantially similar to the upper signal contacts 32 (see FIG. 1). Each contact 62 in the upper row 63a is vertically aligned with a respective contact 62 in the lower row 63b. This arrangement forms a series of vertically-aligned differential contact pairs $DP_{Ln}$ (see FIG. 7).

The lower connector portion 20 further comprise a plurality of lower tails 66 (see FIG. 2). A first end 66a of each lower tail 66 is electrically coupled to the terminal end 62b of a respective upper signal contact 62. A second end 66b of each lower tail 66 is electrically coupled to the circuit substrate 16.

The lower connector portion 20 mates with a suitable electrical connector such as the above-described cable plug 38. The lower signal contacts 62 and the contacts 48 of the cable plug 38 produce unwanted cross-talk when electrical signals are transmitted between the lower connector portion 20 and the cable plug 38. Applicant has configured the connector system 12 so that this unwanted cross-talk is offset by compensating cross-talk produced in the circuit substrate 16. Details relating to this cross-talk-reduction technique follow. (A portion of the unwanted cross-talk associated with the lower signal contacts 62 can also be reduced using the lower tails 66 and the cross-talk-reduction technique previously described in connection with the upper tails 64.)

The circuit substrate 16 is formed from a dielectric material such as FR4 glass-reinforced epoxy resin. The circuit substrate 16 comprises a plurality of layers. The layers are formed by conventional techniques and are sandwiched together using, for example, adhesive.

FIGS. 8 through 14 illustrate an exemplary embodiment of the circuit substrate 16.

The exemplary circuit substrate 16 is a multi-layer board (MLB) 301. The MLB 301 includes six layers. The MLB 301 comprises a first layer 305 having an upper surface 303 (see FIG. 8). The electrical connector 14 is mounted on the upper surface 303. The first layer 305 includes a plurality of plated through holes 307 and 309. The through holes 307 and 309 accommodate the terminals 21a of the outer shield 21 and the hold-downs 21b secured to the housing 20 of the electrical connector 14.

Figure 8:
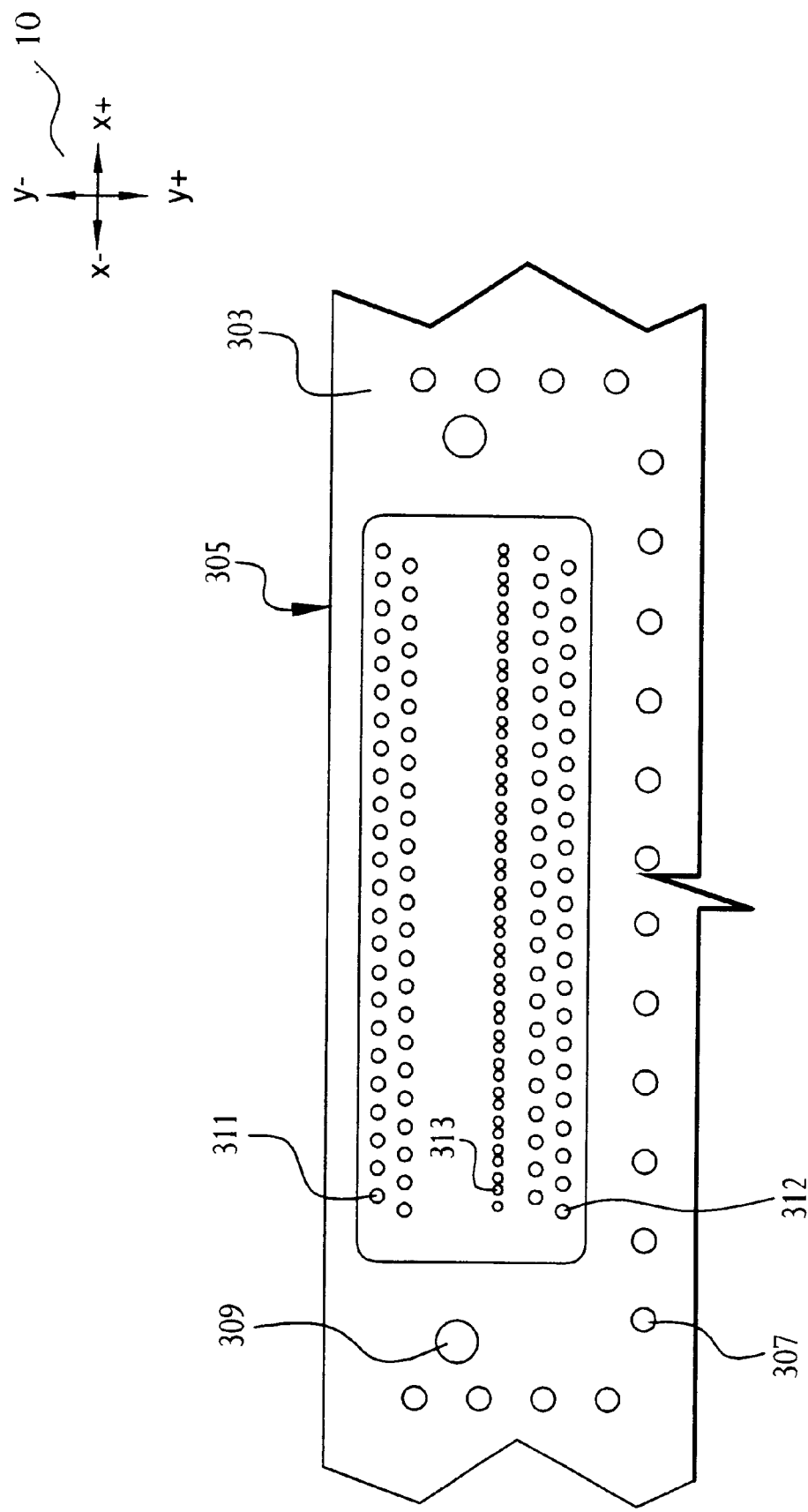
FIG. 8 is a plan view of a first layer of a multi-layer circuit substrate of the electrical connector system shown in FIGS. 1 and 2.

The first layer 305 also includes a first plurality of plated through holes 311 and vias 313. The through holes 311 receive the second ends 66b of the lower tails 66 of the electrical connector 14. Additional circuitry (not shown) on the MLB 301 is routed through the vias 313. The through holes 311 can be arranged in two rows and the vias 313 can be arranged in one row, as shown in FIG. 8. Alternative arrangements for the through holes 311 and the vias 313 are also possible. The first layer 305 also includes a second plurality of plated through holes 312. The through holes 312 receive the second ends 34b of the upper tails 34.

A predetermined arrangement of conductive paths or traces extend between the through holes 311 and the vias 313 on the second layer 319 (and on the various other layers of the MLB 301). The conductive paths cause a compensating cross-talk to be produced within the MLB 301. This compensating cross-talk offsets the unwanted cross-talk associated with the lower connector portion 20, as noted previously.

Figure 9:
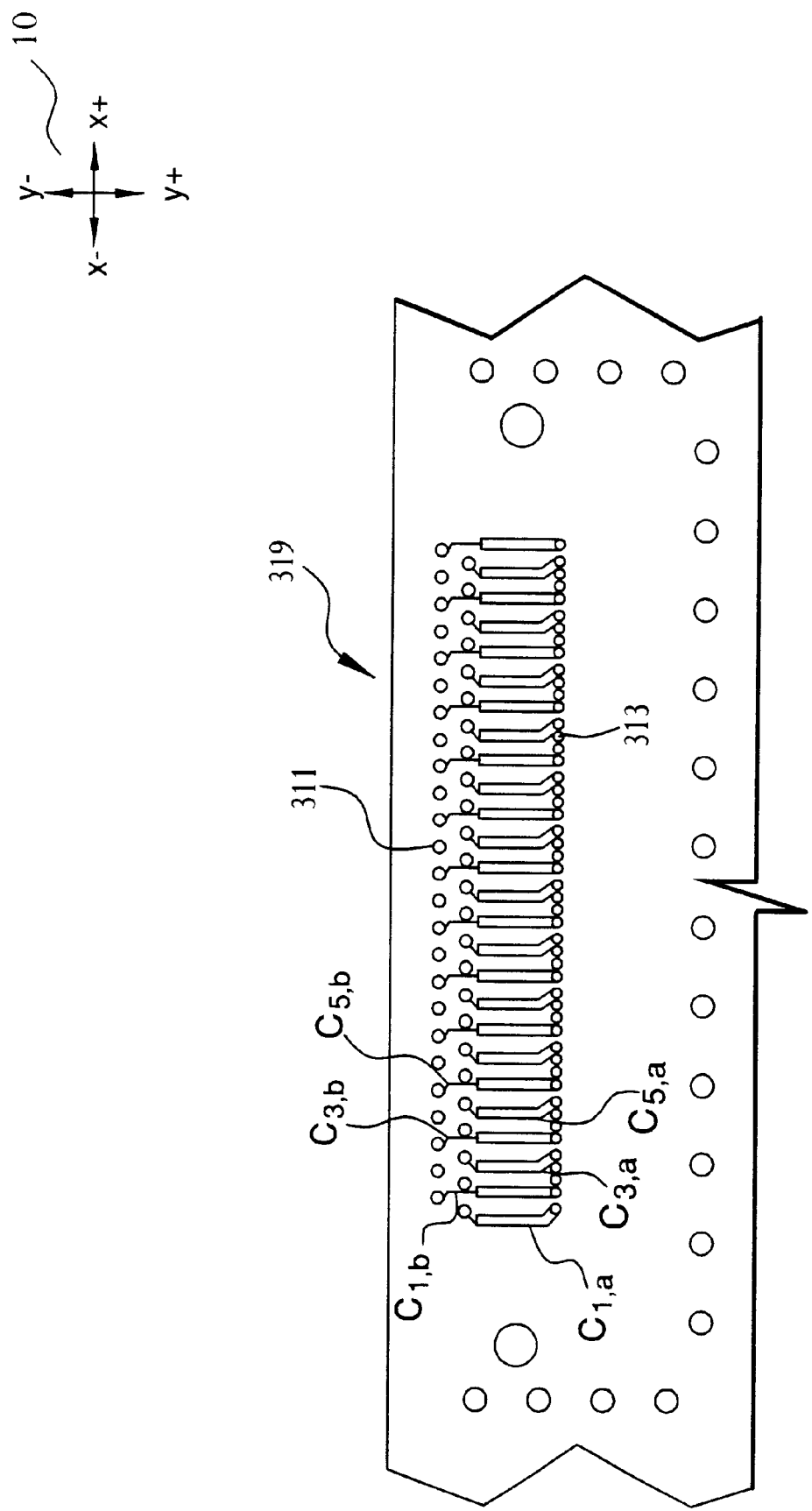
FIG. 9 is a plan view of a second layer of the multi-layer circuit substrate shown in FIG. 8.

The conductive paths are formed on the layers of the MLB 301 using conventional techniques such as photolithography. The conductive paths, in general, are grouped in pairs that each correspond to a respective differential pair $DP_{Ln}$ of lower signal contacts 62. Each pair of conductive paths comprises a first conductor $C_{n,a}$ and a second conductor $C_{n,b}$. For example, FIG. 9 depicts a conductor pair $C_{n,a}$, $C_{n,b}$ that comprises a first conductor $C_{1,a}$ and a second conductor $C_{1,b}$. The first and second conductors $C_{1,a}$ and $C_{1,b}$ are electrically coupled to the differential contact pair $DP_{L1}$ of the lower connector portion 20.

Figure 11:
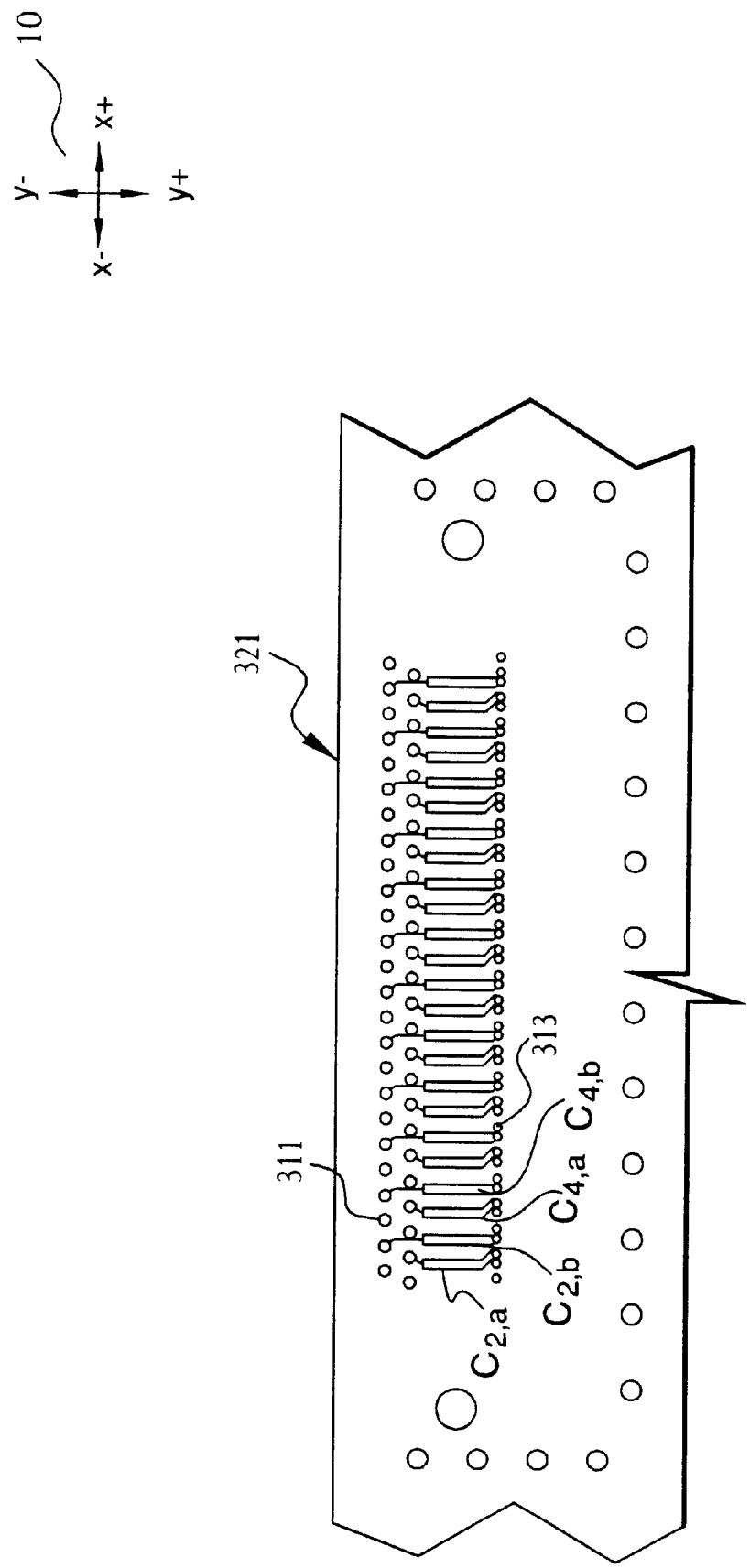
FIG. 11 is a plan view of a third layer of the multi-layer circuit substrate shown in FIGS. 8–10.

The MLB 301 includes a second layer 319 and a third layer 321 (see FIGS. 9 and 11). The conductors $C_{n,a}$ and $C_{n,b}$ on the second layer 319 are preferably spaced apart from the conductors $C_{n,a}$ and $C_{n,b}$ on the first layer 305 by a distance of approximately 0.030 inch. The conductors $C_{n,a}$ and $C_{n,b}$ on the second layer 319 are preferably spaced apart from the conductors $C_{n,a}$ and $C_{n,b}$ on the third layer 321 by approximately 0.005 inch. The second and third layers 319 and 321 produce compensating cross-talk by inductively and capacitively coupling conductor pairs $C_{n,a}$, $C_{n,b}$ that correspond to adjacent differential pairs $DP_{Ln}$ of lower signal contacts 62. Inductive coupling occurs due to the flow of current through the conductor pairs $C_{n,a}$, $C_{n,b}$ between the through holes 311 and the vias 313. Capacitive coupling is achieved by placing conductor pairs $C_{n,a}$, $C_{n,b}$ that correspond to adjacent differential contact pairs $DP_{Ln}$ on alternating layers of the MLB 301.

For example, the second layer 319 includes a first pair of conductors $C_{1,a}$, $C_{1,b}$, a second pair of conductors $C_{3,a}$, $C_{3,b}$, and a third pair of conductors $C_{5,a}$, $C_{5,b}$ (see FIG. 9). The conductor pair $C_{1,a}$, $C_{1,b}$ corresponds to the differential contact pair $DP_{L1}$ on the lower connector portion 20 (see FIG. 7). The conductor pair $C_{3,a}$, $C_{3,b}$ corresponds to the differential contact pair $DP_{L3}$, and the conductor pair $C_{5,a}$, $C_{5,b}$ corresponds to the differential contact pair $DP_{L5}$. The third layer 321 includes a first pair of conductors $C_{2,a}$, $C_{2,b}$, and a second pair of conductors $C_{4,a}$, $C_{4,b}$, (see FIG. 11). The conductor pair $C_{2,a}$, $C_{2,b}$ corresponds to the differential contact pair $DP_{L2}$ on the lower connector portion 20, and the conductor pair $C_{4,a}$, $C_{4,b}$ corresponds to the differential contact pair $DP_{L4}$.

Figure 10:
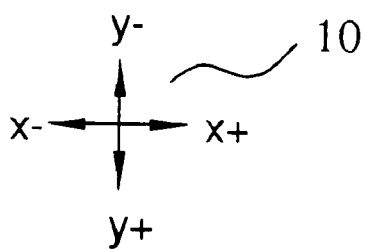
FIG. 10 is a detailed view of a portion of the circuit-substrate layer shown in FIG. 9 with conductors from an adjacent layer shown in phantom.
Figure 10:
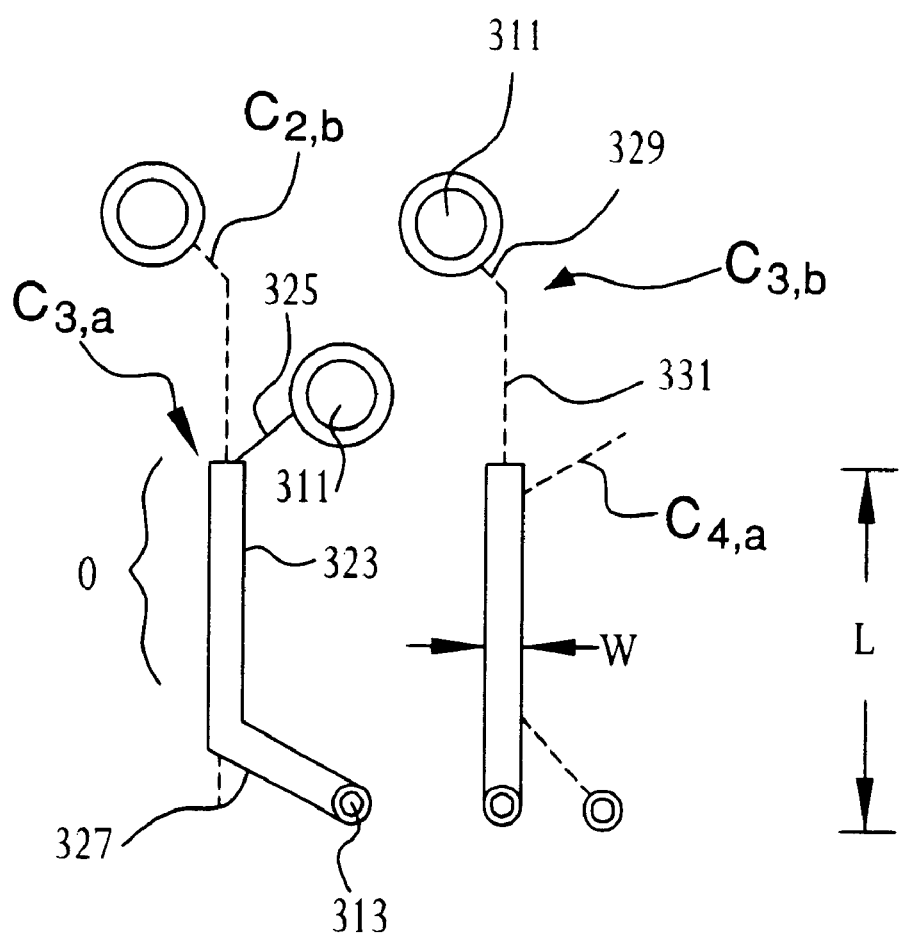

FIG. 10 depicts the third conductor pair $C_{3,a}$, $C_{3,b}$ in detail. The conductor $C_{3,a}$ includes a longitudinally-extending portion 323. The portion 323 is flanked by a first laterally-extending portion 325 and a second laterally-extending portion 327. The conductor $C_{3,b}$ includes a laterally-extending portion 329 and a longitudinally-extending portion 331. The laterally-extending portions 325, 327, and 329 facilitate the separation of conductors $C_{3,a}$ and $C_{3,b}$ as the conductors $C_{3,a}$ and $C_{3,b}$ extend from adjacent though holes 311 to their respective vias 313.

The third layer 321 of the MLB 301 includes a conductor pattern that is substantially identical to the conductor pattern on the second layer 319, with the exception that the layers 319 and 321 accommodate different conductor pairs $C_{n,a}$, $C_{n,b}$. For example, FIG. 11 depicts the conductor pair $C_{2,a}$, $C_{2,b}$ disposed on the third layer 321. The conductor pair $C_{2,a}$ $C_{2,b}$, is arranged in substantially the same pattern as the conductor pair $C_{3,a}$, $C_{3,b}$ on the second layer 319.

The lateral portions 325, 327, and 329 position the respective longitudinal portions 323 and 331 of the conductors $C_{3,a}$ and $C_{3,b}$ in relation to the through holes 311, as described above. The lateral portions 325, 327, and 329 also position the respective longitudinal portions 323 and 331 in relation to corresponding longitudinal portions of the conductors $C_{n,a}$ and $C_{n,b}$ on the third layer 321. More specifically, the longitudinal portions 323 and 331 are positioned so that an overlap occurs between particular conductors $C_{n,a}$ and $C_{n,b}$ on the second and third layers 319 and 321 (the non-overlapping portions of the conductor pair $C_{2,a}$, $C_{2,b}$ are shown in phantom in FIG. 10). This overlap is designated by the symbol "O" in FIG. 10. The overlap O causes the conductor pairs $C_{n,a}$, $C_{n,b}$ on the second and third layers 319 and 321 to produce compensating cross-talk.

The amount of compensating cross talk produced by the conductor pairs $C_{n,a}$, $C_{n,b}$ on the second and third layers 319 and 321 is determined by the geometry of the conductors $C_{n,a}$ and $C_{n,b}$ and the spacing between the second and third layers 319 and 321. In particular, each conductor $C_{n,a}$ and $C_{n,b}$ on the second and third layers 319 and 321 has a narrow portion and a relatively wide portion (see, e.g., FIG. 10). The compensating cross-talk is substantially produced within the wide portion of the conductors $C_{n,a}$ and $C_{n,b}$.

For example, the lateral portion 325 of the conductor $C_{3,a}$ forms the narrow portion of the conductor $C_{3,a}$, as depicted in FIG. 10. The longitudinal portion 323 and the lateral portion 327 form the wide portion of the conductor $C_{3,a}$. The lateral portion 329 and a portion of the longitudinal portion 331 of the conductor $C_{3,b}$, form the narrow portion of the conductor $C_{3,b}$. The remainder of the longitudinal portion 331 forms the wide portion of the conductor $C_{3,b}$.

The wide portions of the conductors $C_{n,a}$ and $C_{n,b}$ occupy the overlaps O, i.e., the wide portions of the conductors $C_{n,a}$ and $C_{n,b}$ on the second layer 319 overlap portions of the corresponding connectors $C_{n,a}$ and $C_{n,b}$ on the third layer 321. The wide portions of the conductors $C_{n,a}$ and $C_{n,b}$ have a width ("W") that is selected so that the conductors $C_{n,a}$ and $C_{n,b}$ produce a desired amount of compensating cross-talk. The width W that is required to produce a given amount of cross-talk is dependent upon the length ("L") of the conductors $C_{n,a}$ and $C_{n,b}$ (the length L corresponds to the distance between the through hole 311 and the via 313 between which the conductors $C_{n,a}$ and $C_{n,b}$ extend). The optimum length L for the conductors $C_{n,a}$ and $C_{n,b}$, by in general, decreases with increasing connector width W.

For example, a conductor $C_{n,a}$ or $C_{n,b}$ having a length L of 0.282 inch and a nominal thickness of 0.001-inch, and extending between a 0.52-inch-diameter pad mounted in the through hole 311 and a 0.0290-inch-diameter pad mounted in the via 313 optimally has a wide-portion width W of approximately 0.016 inch and a narrow-portion width of approximately 0.008 inch.

Figure 12:
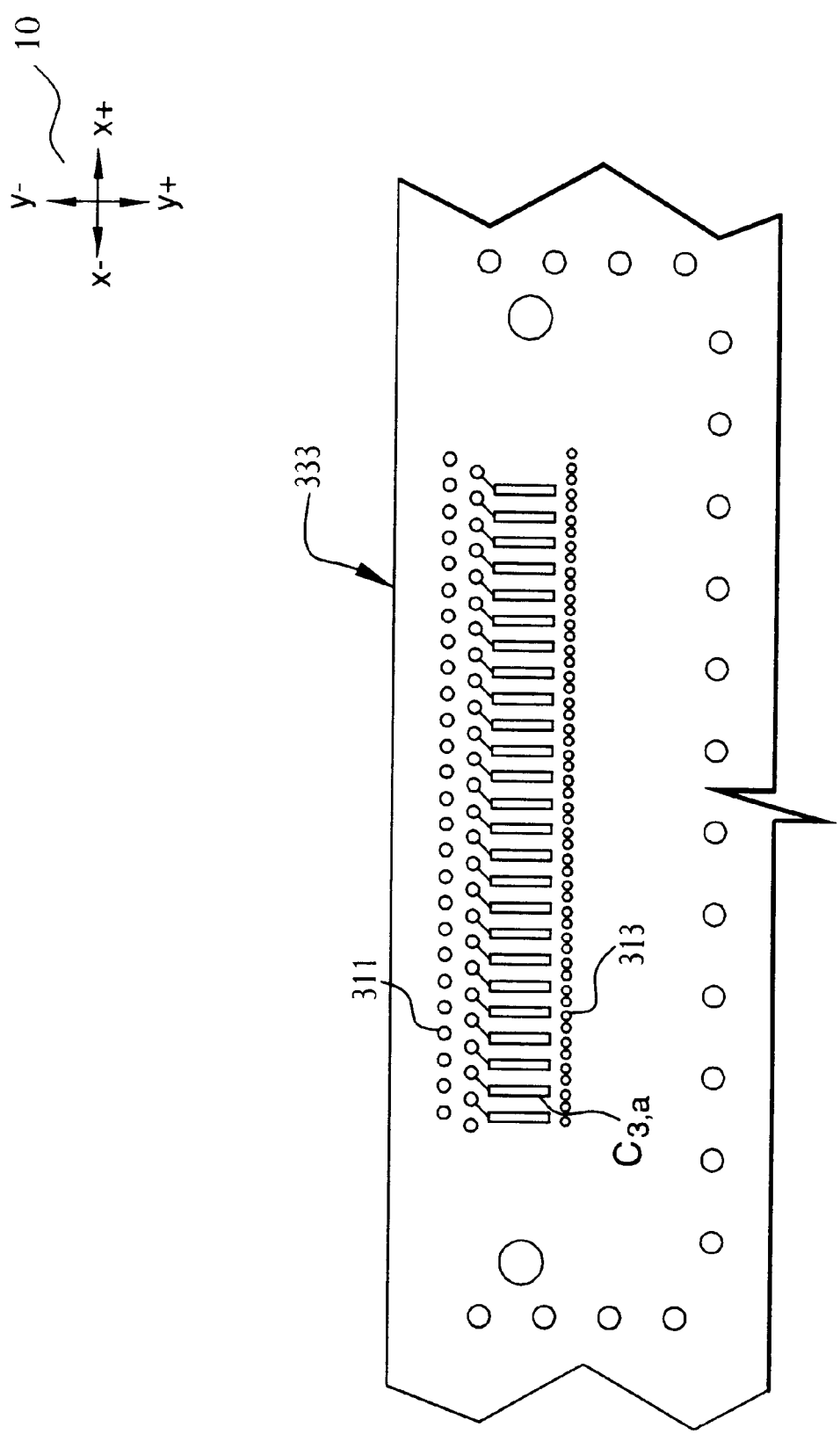
FIG. 12 is a plan view of a fourth layer of the multi-layer circuit substrate shown in FIGS. 8–11.
Figure 14:
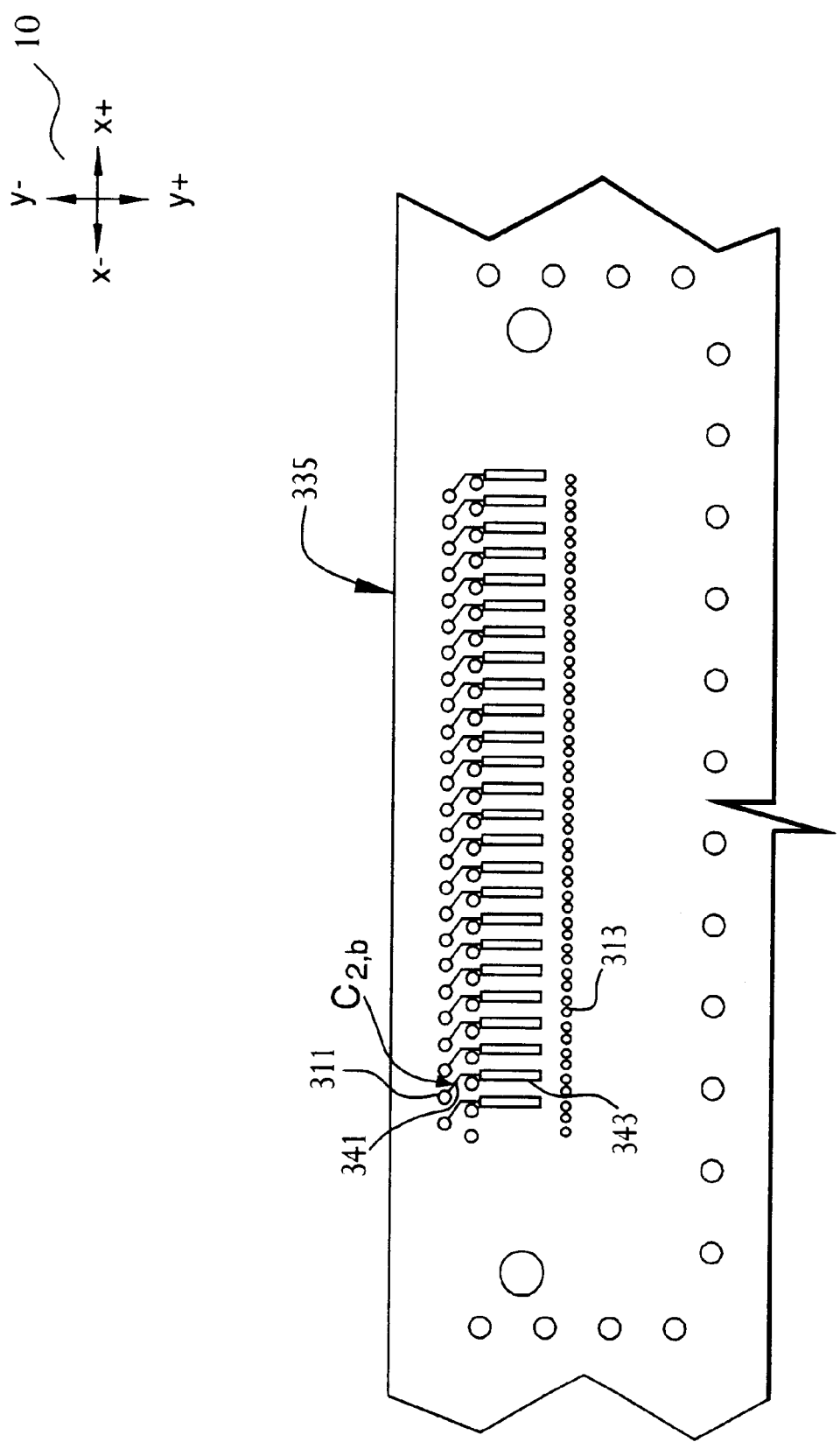
FIG. 14 is a plan view of a fifth layer of the multi-layer circuit substrate shown in FIGS. 8–13.

The MLB 301 further includes a fourth layer 333 and an adjacent fifth layer 335 (see FIGS. 12 and 14). The conductor pairs $C_{n,a}$, $C_{n,b}$ on the fourth layer 333 are preferably spaced apart from the conductor pairs $C_{n,a}$, $C_{n,b}$ on the third layer 321 by approximately 0.011 inch. The conductor pairs $C_{n,a}$, $C_{n,b}$ on the fourth layer 333 are preferably spaced apart from the conductor pairs $C_{n,a}$, $C_{n,b}$ on the fifth layer 335 by approximately 0.005 inch.

The fourth and fifth layers 333 and 335 are utilized to create a compensating cross-talk. This compensating cross-talk offsets the unwanted cross-talk that occurs between conductor pairs $C_{n,a}$, $C_{n,b}$ which are coupled to non-adjacent differential contact pairs $DP_{Ln}$ on the lower connector portion 20. The fourth and fifth layers 333 and 335 produce the compensating cross-talk by capacitively coupling conductor pairs $C_{n,a}$, $C_{n,b}$ that correspond to non-adjacent differential contact pairs $DP_{Ln}$.

Figure 7:
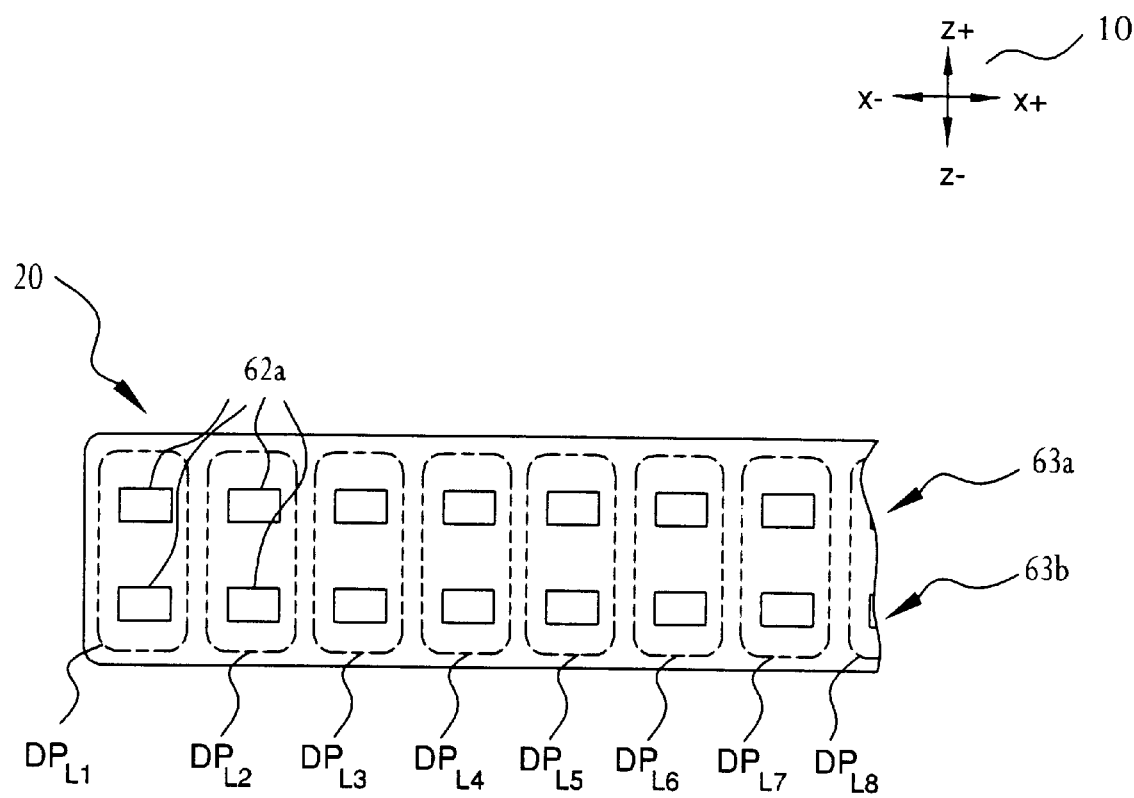
FIG. 7 is a diagrammatical front view of a lower connector portion of the electrical connector shown in part in FIG. 3.

The first differential pair $DP_{L1}$ of lower signal contacts 62 is once removed from the third differential pair $DP_{L3}$, as shown in FIG. 7. In other words, the second differential pair $DP_{L2}$ resides between the first and the third differential pairs $DP_{L1}$ and $DP_{L3}$ in the lower connector portion 20. The fourth layer 333 and the fifth layer 335 create a compensating cross-talk that offsets unwanted cross-talk between once-removed differential pairs $DP_{Ln}$ of lower signal contacts 62. This effect is achieved by placing the conductors $C_{n,a}$ and $C_{n,b}$ that correspond to each differential pair $DP_{Ln}$ on alternating layers of the MLB 301. In other words, each conductor pair $C_{n,a}$, $C_{n,b}$ is split between the fourth and fifth layers 333 and 335. For example, the fourth layer 333 has the first conductor $C_{3,a}$ from the differential pair $DP_{L3}$ disposed thereon (see FIG. 12). The other conductor $C_{3,b}$ from the differential pair $DP_{L3}$ resides on the fifth layer 335 (see FIG. 14). In addition, the second conductor $C_{2,b}$ from the differential pair $DP_{L2}$ is disposed on the fifth layer 335 in a position that causes the conductors $C_{3,a}$ and $C_{2,b}$ to partially overlap (see FIG. 13).

Figure 13:
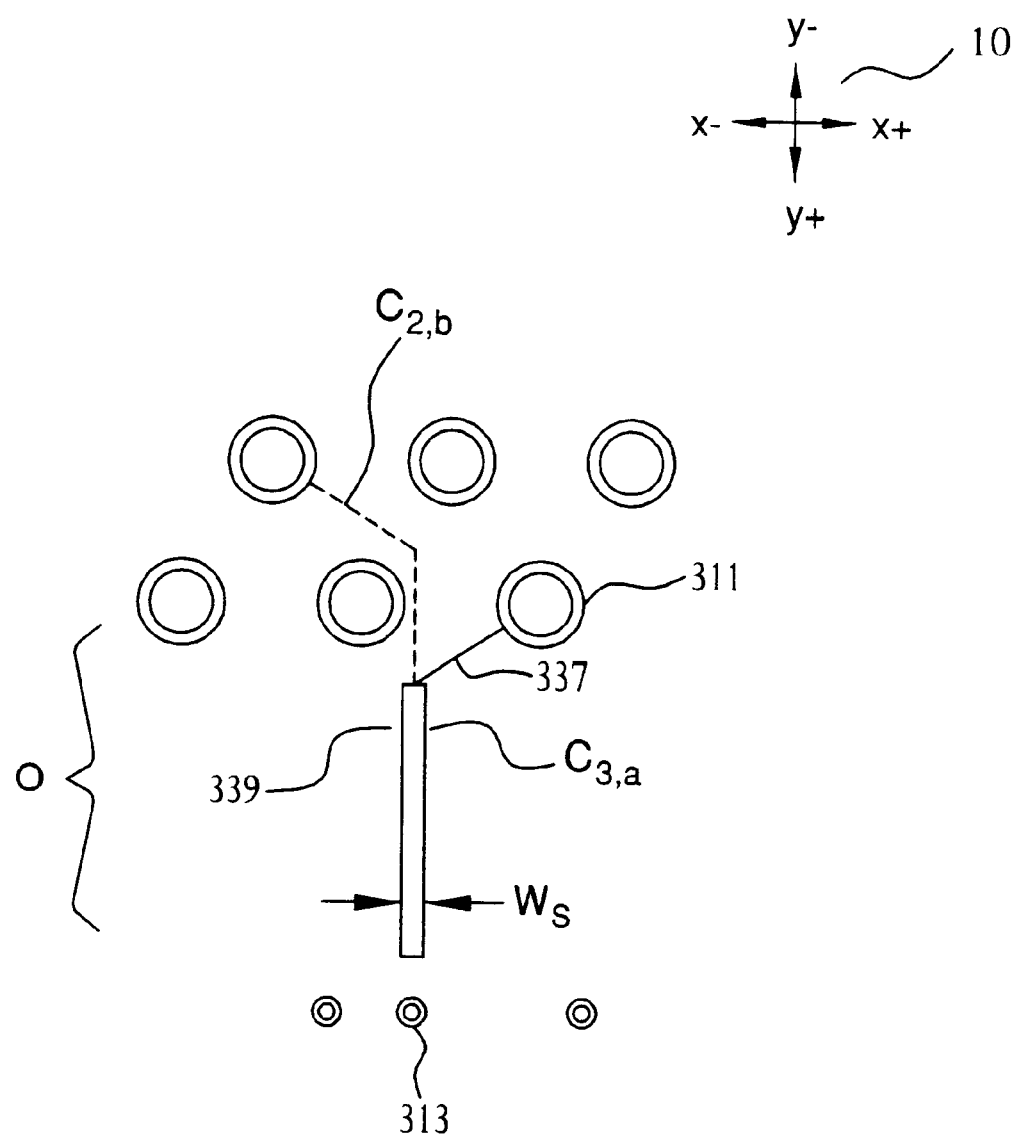
FIG. 13 is a detailed view of a portion of the circuit-substrate layer shown in FIG. 12 with conductors from an adjacent layer shown in phantom.

The conductor $C_{3,a}$ is a stub that does not fully extend between the corresponding through hole 311 and via 313 on the fourth layer 333, as shown in the detailed view of Figure 13. The conductor $C_{3,a}$ has a laterally-extending portion 337 and a longitudinally-extending portion 339. The laterally-extending portion 337 aligns the longitudinally-extending portion 339 with an adjacent via 313.

The fifth layer 335 incorporates a conductor arrangement that is substantially similar to that of the fourth layer 333. The conductor $C_{2,b}$ is a stub that does not fully extend between the corresponding through hole 311 and via 313 on the fifth layer 335, as shown in FIG. 15. The conductor $C_{2,a}$ has a laterally-extending portion 341 and a longitudinally-extending portion 343. The laterally-extending portion 341 aligns the longitudinally-extending portion 343 with an adjacent via 313. In addition, the laterally-extending portions 337 and 341 of the respective conductors $C_{3,a}$ and $C_{2,b}$ position the respective longitudinal portions 339 and 343 so that the longitudinal portions 339 and 343 form an overlap O (see FIG. 13). This overlap o creates the compensating cross-talk that offsets the unwanted cross-talk between once removed differential pairs, e.g., $DP_{L1}$ and $DP_{L3}$, $DP_{L2}$ and $DP_{L4}$, etc.

The amount of compensating cross-talk produced by the fourth and fifth layers 333 and 335 is determined by the conductor geometry on the layers 333 and 335, and by the spacing between the layers 333 and 335. Each conductor $C_{n,a}$ and $C_{n,b}$ on the fourth and fifth layers 333 and 335 has a narrow portion and a wide portion. For example, the narrow portion of each conductor $C_{3,a}$ is formed by the lateral portion 337 of the conductor $C_{3,a}$. The wide portion of each conductor $C_{3,a}$ is formed by the longitudinal portion 339 of the conductor $C_{3,a}$.

Hence, the wide portions of the conductors $C_{n,a}$ and $C_{n,b}$ on the fourth and fifth layers 333 and 335 form the overlaps O between those conductors (see FIG. 13). The width ($W_s$) of the wide portions of the conductors $C_{n,a}$ and $C_{n,b}$ is selected so as to produce a desired amount of cross-talk. The optimal width $W_s$ is dependent upon the stub length ($L_s$) of the conductors $C_{n,a}$ and $C_{n,b}$. A longer stub length $L_s$, in general, necessitates a smaller width $W_s$.

For example, a conductor having a stub length $L_s$, of 0.282 inch and a nominal thickness of 0.001 inch, and extending between a 0.52-inch-diameter pad mounted in the through hole 311 and a 0.0290-inch-diameter pad mounted in the via 313 should have a wide portion width W, of approximately 0.016 inch and a narrow-portion width of approximately 0.008 inch.

Other configurations for the circuit substrate 16 are possible. For example, various alternative embodiments of the circuit substrate 16 are described in co-pending U.S. patent application Ser. No. 09/353,184, filed Jul. 14, 1999 and titled "Electrical Connector System with Cross-Talk Compensation," which is incorporated herein by reference in its entirety.

The present invention optimally combines different cross-talk reduction techniques to substantially reduce or eliminate unwanted cross-talk in the connector system 12, as demonstrated by the above discussion. The invention achieves this result while adding minimally to the overall dimensions of the connector system 12. For example, Applicant has found that the span required for the upper tails 34 to reach the circuit substrate 16 is sufficient to facilitate the use of the upper tails 34 as the sole means of cross-talk reduction for the upper signal contacts 32. Hence, the present invention achieves cross-talk reduction for the upper connector portion 18 without the use of any hardware in addition to that normally required for the transmission of electrical signals through the upper connector portion 18.

Applicant has combined the above-noted cross-talk-reduction technique with another space-efficient technique that is optimally suited for the lower connector portion 18, i.e., using the circuit substrate 16 for cross-talk reduction. Furthermore, the use of the upper tails 34 as the sole means of cross-talk reduction for the upper signal contacts 32 obviates any need to perform this function within the circuit substrate 16. Thus, any increases in the dimensions or the complexity of the circuit substrate 16 due to the cross-talk-compensation circuitry for the electrical connector 14 are minimal.

The connector system 12 provides substantial advantages in the current commercial market for electrical connectors. In particular, manufacturers of most types of electronic devices are under substantial consumer pressure to reduce the overall dimensions of their products. Reducing the footprints of the various connectors used within an electronic device is one way of achieving such dimensional reductions. Reducing the overall dimensions of electrical connectors is increasingly challenging, however, as contemporary standards for cross-talk become more stringent. Hence, a compact connector system such as the system 12 that exhibits minimal cross-talk is of particular value in the current commercial market.

It is to be understood that even though numerous characteristics and advantages of the present invention have been set forth in the foregoing description, together with details of the structure and function of the invention, the disclosure is illustrative only, and changes may be made in detail, especially in matters of shape, size, and arrangement of the parts, within the principles of the invention to the full extent indicated by the broad general meaning of the terms in which the appended claims are expressed. For example, the cross-talk compensation for the lower signal contacts 62 does not necessarily have to be performed using the particular technique described herein, i.e., the electrical connector 14 is not limited to use with multi-layer substrates such as the circuit substrate 16. For example, cross-talk compensation for the lower signal contacts 62 may be achieved using the techniques described in U.S. Pat. Nos. 5,299,956 and 5,310,363, each of which is incorporated herein by reference in its entirety. In addition, a portion of the cross-talk compensation for the upper connector could also be performed on the PCB.

What is claimed is:

1. An electrical connector system comprising an electrical connector, the electrical connector comprising:

a plurality of upper signal contacts arranged in at least two rows of vertically-aligned pairs;

a plurality of upper tails, each of the upper tails having a first end electrically coupled to a respective upper signal contact and a second end adapted to be electrically coupled to a circuit substrate, the upper tails having a predetermined length and being spaced apart by one or more predetermined distances so that the upper tails produce a first compensating cross-talk, wherein the first compensating cross-talk offsets unwanted cross-talk produced by the upper signal contacts; and a plurality of lower signal contacts adapted to be electrically coupled to a substrate, the lower signal contacts being aligned with the upper signal contacts so that the lower signal contacts are substantially located between the upper signal contacts and the circuit substrate when the connector is attached thereto.

2. The electrical connector system as recited in claim 1, wherein each of the vertically-aligned pairs of upper signal contacts is electrically coupled to a respective first and second upper tail, the respective first and second upper tails being positioned substantially side by side.

3. The electrical connector system as recited in claim 2, wherein (i) the respective first and second upper tails are spaced apart by a first predetermined distance, (ii) the respective first and second upper tails are symmetrically disposed about a centerline, (iii) the centerlines of adjacent pairs of the respective first and second upper tails are spaced apart by a second predetermined distance, and (iv) the first predetermined distance is equal to at least one-half of the second predetermined distance.

4. The electrical connector system as recited in claim 2, wherein the upper tails are substantially co-planar.

5. The electrical connector system as recited in claim 4, wherein the upper tails deviate from absolute co-planarity by a distance no greater than approximately one-half of the second predetermined distance.

6. The electrical connector system as recited in claim 1, further comprising a lead frame, wherein the tails are formed as part of the lead frame.

7. The electrical connector system as recited in claim 6, wherein the lead frame is insert molded.

8. The electrical connector system as recited in claim 1, further comprising a circuit substrate, said circuit substrate comprising:
   a plurality of layers;
   at least a first, a second, and a third trace formed on the substrate, wherein each of the first, second, and third traces is electrically coupled to a respective lower signal contact, and the first trace includes (i) a first portion formed on at least one of the plurality of layers and adjacent a portion of the second trace to produce second compensating cross-talk and (ii) a second portion formed on at least one of the plurality of layers and adjacent a portion of the third trace to produce third compensating cross-talk, the second and the third compensating cross-talks offsetting unwanted cross-talk between the lower signal contacts.

9. The electrical connector system as recited in claim 8, wherein the first, second, and third traces each comprise one of a pair of traces that form differential pairs.

10. The electrical connector system as recited in claim 8, wherein the first and second portions of the first trace reside entirely underneath the connector.

11. The electrical connector system as recited in claim 8, further comprising a plurality of lower tails, each of the lower tails being electrically coupled to a respective lower signal contact and at least one of the first, second, and third traces.

12. The electrical connector system as recited in claim 8, wherein the first portion of the first trace resides on a first of the layers and the portion of the second trace resides on a second of the layers, the second layer being adjacent the first layer.

13. The electrical connector system as recited in claim 12, wherein the first portion of the first trace is superimposed over the portion of the second trace.

14. The electrical connector system as recited in claim 12, wherein the second portion of the first trace resides on a third layer and the portion of the third trace resides on an adjacent fourth layer.

15. The electrical connector system as recited in claim 14, wherein the second portion of the first trace is superimposed over the portion of the third trace.

16. The electrical connector system as recited in claim 8, wherein the circuit substrate further comprises a fourth trace, and the first trace further comprises a third portion on at least one other of the plurality of layers and adjacent a portion of the fourth trace in order to produce a third compensating cross-talk, whereby the first, second and third compensating cross-talks offset the unwanted cross-talk.

17. The electrical connector system as recited in claim 16, wherein the third portion of the first trace resides on a different layer than the fourth trace.

18. The electrical connector system as recited in claim 16, wherein the third portion of the first trace resides on the same layer as the fourth trace.

19. The electrical connector system as recited in claim 16, wherein the unwanted cross-talk and the first, second, and third compensating cross-talks are near-end cross-talks.

20. The electrical connector system as recited in claim 16, wherein the first, second, and third portions of the trace reside entirely underneath the electrical connector.

21. An electrical connector adapted to engage a circuit substrate, the electrical connector comprising:
   an upper connector portion, the upper connector portion comprising (i) a plurality of upper signal contacts arranged in at least two rows of vertically-aligned pairs and (ii) a plurality of tails each having a pre-determined length, wherein each of the vertically-aligned pairs of upper signal contacts is electrically coupled to a respective first and second tail, the first and the second tails being positioned substantially side-by-side, the plurality of tails being substantially co-planar and being spaced apart by one or more pre-determined distances so that the tails are capable of producing a compensating cross-talk that offsets an unwanted cross-talk produced by the upper signal contacts; and
   a lower connector portion being substantially aligned with the upper connector portion so that the lower connector portion is substantially located between the upper connector portion and the circuit substrate.

22. The electrical connector as recited in claim 21, further comprising a lead frame, wherein the upper tails are formed as part of the lead frame.

23. The electrical connector as recited in claim 21, wherein the lower connector portion comprises a plurality of lower signal contacts and a plurality of lower tails, each of the lower signal contacts being electrically coupled to a respective lower tail.

24. The electrical connector as recited in claim 23, wherein the upper connector portion further comprises an upper housing and the lower connector portion further comprises a lower housing, the upper signal contacts being substantially located within the upper housing and the lower signal contacts being substantially located within the lower housing.

25. The electrical connector as recited in claim 24, further comprising an outer shield being adapted to engage the substrate, the upper and lower connector portions being fixedly coupled to the outer shield.

26. The electrical connector as recited in claim 25, wherein the upper housing comprises (i) a mating portion adapted to receive a first mating connector and (ii) a mounting portion adapted to engage the outer shield.

27. The electrical connector as recited in claim 26, wherein the lower housing comprises (i) a mating portion adapted to receive a second mating connector and (ii) a mounting portion adapted to engage the outer shield.

28. The electrical connector as recited in claim 21, wherein (i) the respective first and second upper tails are spaced apart by a first predetermined distance, (ii) the respective first and second upper tails are symmetrically disposed about a centerline, (iii) the centerlines of adjacent pairs of the respective first and second upper tails are spaced apart by a second predetermined distance, and (iv) the first predetermined distance is equal to at least one-half of the second predetermined distance.

29. The electrical connector as recited in claim 28, wherein the upper tails deviate from absolute co-planarity by a distance no greater than approximately one-half of the second predetermined distance.

30. A method of reducing cross-talk in an electrical-connector system mounted to a circuit substrate, comprising the steps of:
   providing an electrical-connector system, the electrical-connector system having a lower electrical connector and a stacked, upper electrical connector, each electrical connector including contacts with tails and producing an unwanted cross-talk;
   providing a circuit substrate to receive the tails;
   producing a compensating cross-talk in the tails of the contacts of the upper connector to reduce the unwanted cross-talk of the upper connector; and
   producing a compensating cross-talk in the circuit substrate to reduce the unwanted cross-talk of the lower connector.

* * * * *